(12) United States Patent
Hsieh et al.

(10) Patent No.: US 10,361,686 B2
(45) Date of Patent: Jul. 23, 2019

(54) SCAN OUTPUT FLIP-FLOPS

(71) Applicant: MEDIATEK INC., Hsin-Chu (TW)

(72) Inventors: Min-Hang Hsieh, Taipei (TW);
Wei-Min Hsu, New Taipei (TW);
Jen-Hang Yang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 174 days.

(21) Appl. No.: 15/634,007

(22) Filed: Jun. 27, 2017

(65) Prior Publication Data
US 2018/0375500 A1 Dec. 27, 2018

(51) Int. Cl.
*H03K 3/356* (2006.01)
*G01R 31/3177* (2006.01)
*G01R 31/317* (2006.01)
*H03K 3/012* (2006.01)
*H03K 3/037* (2006.01)
*H03K 3/3562* (2006.01)

(52) U.S. Cl.
CPC ... *H03K 3/356104* (2013.01); *G01R 31/3177* (2013.01); *G01R 31/31723* (2013.01); *G01R 31/31727* (2013.01); *H03K 3/012* (2013.01); *H03K 3/0372* (2013.01); *H03K 3/35625* (2013.01)

(58) Field of Classification Search
CPC .... H03K 3/037; H03K 3/0372; H03K 3/0375; H03K 3/356104; H03K 3/356113; H03K 3/356121; H03K 3/356147; H03K 3/356156; H03K 3/3562; H03K 3/35625; G01R 31/31721; G01R 31/317723; G01R 31/31727; G01R 31/3177; G01R 31/3181; G01R 31/3185; G01R 31/318533; G01R 31/318541; G01R 31/318552
See application file for complete search history.

(56) References Cited

U.S. PATENT DOCUMENTS

| 7,831,871 | B2 | 11/2010 | Ross et al. | |
| 9,557,380 | B2 | 1/2017 | Chen et al. | |
| 2008/0101513 | A1* | 5/2008 | Zhu | H03K 3/0375 375/354 |
| 2017/0269156 | A1* | 9/2017 | Fel | G01R 31/31854 |

FOREIGN PATENT DOCUMENTS

TW I543535 B 7/2016

* cited by examiner

*Primary Examiner* — Lincoln D Donovan
*Assistant Examiner* — Diana J. Cheng
(74) *Attorney, Agent, or Firm* — McClure, Qualey & Rodack, LLP

(57) ABSTRACT

A scan output flip-flop is provided. The scan output flip-flop outputs a scan-out signal at a first output terminal and includes a selection circuit, a control circuit, and a scan-out stage circuit. The selection circuit is controlled by a first test enable signal to transmit a data signal on a first input terminal or a test signal on a second input terminal to an output terminal of the selection circuit to serve as an input signal. The control circuit is coupled to the output terminal of the selection circuit and controlled by a first clock signal to generate a first control signal and a second control signal according to the input signal. The second control signal is the inverse of the first control signal. The scan-out stage circuit is controlled by the first control signal and the second control signal to generate the scan-out signal.

20 Claims, 13 Drawing Sheets

SCAN OUTPUT FLIP-FLOPS

BACKGROUND OF THE INVENTION

Field of the Invention

The invention relates to a flip-flop, and more particularly, to a scan output flip-flop applied in a scan chain for testing.

Description of the Related Art

Scan chains are applied to detect various manufacturing faults in combinatorial logic blocks during test procedures. Generally, a scan chain is composed of several scan output flip-flops which are coupled in series, and a delay chain is added in the scan path between the data output terminal Q of one scan output flip-flop and the scan-in terminal TD of the following scan output flip-flop. However, in a normal mode, the buffers in the delay chains still operate, which increase unnecessary power consumption. Thus, a scan output flip-flop with an additional scan-output terminal SQ and a scan-out circuit is provided. When this type of scan output flip-flop is applied in a scan chain, a delay chain is added in the scan path between the scan-out terminal SQ of one scan output flip-flop and the scan-in terminal TD of the following scan output flip-flop. In this case, the scan-out circuit in each scan output flip-flop gates the signal of the scan-out terminal SQ at a fixed level in the normal mode, which avoids additional power consumption by the delay chains. Unfortunately, the scan-out circuit may occupy a larger area in the scan output flip-flop, have low driving capabilities, or induce an ERC error.

BRIEF SUMMARY OF THE INVENTION

One exemplary embodiment of a scan output flip-flop for outputting a scan-out signal at a first output terminal of the scan output flip-flop is provided. The scan output flip-flop comprises a selection circuit, a control circuit, and a scan-out stage circuit. The selection circuit has a first input terminal and a second input terminal. The selection circuit is controlled by a first test enable signal to transmit a data signal on the first input terminal or a test signal on the second input terminal to an output terminal of the selection circuit to serve as an input signal. The control circuit is coupled to the output terminal of the selection circuit and controlled by a first clock signal to generate a first control signal and a second control signal according to the input signal. The second control signal is the inverse of the first control signal. The scan-out stage circuit is controlled by the first control signal and the second control signal to generate the scan-out signal.

Another exemplary embodiment of a scan output flip-flop for outputting a scan-out signal at a first output terminal of the scan output flip-flop is provided. The scan output flip-flop comprises a multiplexer, a control circuit, a first-type transistor, a first second-type transistor, and a second second-type transistor. The multiplexer receives a data signal and a test signal and generates an input signal. The multiplexer is controlled by a first test enable signal to select either the data signal or the test signal to serve as the input signal. The control circuit receives the input signal. The control circuit is controlled by a first clock signal to generate a first control signal and a second control signal according to the input signal. The second control signal is the inverse of the first control signal. The first-type transistor has a control electrode receiving the second control signal, a first electrode receiving the first test enable signal or a second test enable signal, and a second electrode coupled to the first output terminal of the scan output flip-flop. The second test enable signal is the inverse of the first test enable signal. The first second-type transistor has a control electrode receiving the first control signal, a first electrode receiving the first test enable signal or the second test enable signal, and a second electrode coupled to the first output terminal of the scan output flip-flop. The second second-type transistor has a control electrode receiving the second control signal, a first electrode coupled to a power terminal of the scan output flip-flop, and a second electrode coupled to the first output terminal of the scan output flip-flop.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
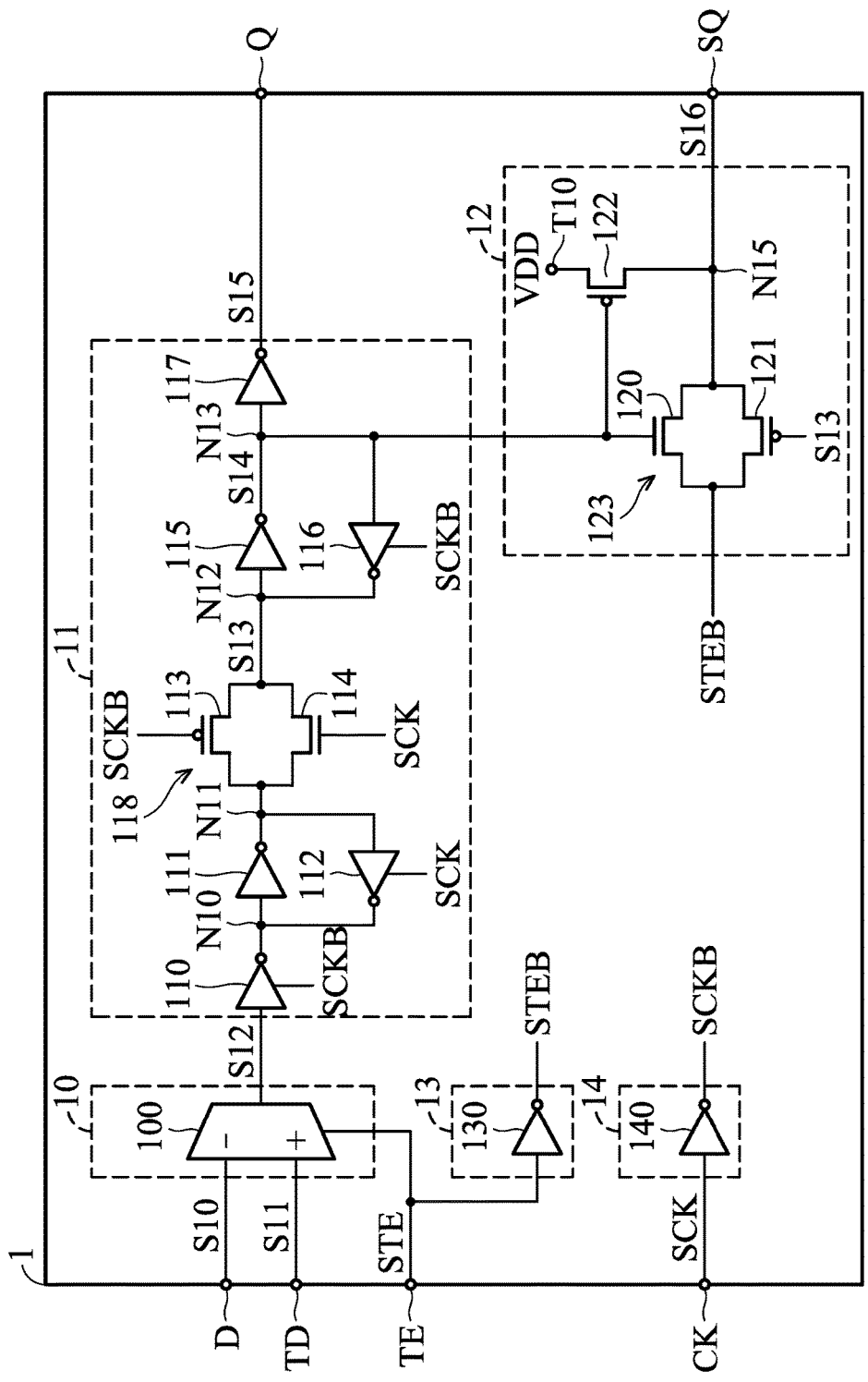
FIG. 1 shows one exemplary embodiment of a scan output flip-flop.

FIG. 1 shows one exemplary embodiment of a scan output flip-flop. As shown in FIG. 1, a scan output flip-flop 1 comprises a selection circuit 10, a control circuit 11, a scan-out stage circuit 12, a signal generation circuit 13, and a clock generation circuit 14. The scan output flip-flop 1 has input terminals D and TD, a test-enable terminal TE, a clock input terminal CK, a data output terminal Q, and a scan output terminal SQ. In the embodiment of FIG. 1, the selection circuit 10 comprises a multiplexer 100. An input terminal (−) of the multiplexer 100 is coupled to the input terminal D for receiving a data signal S10, an input terminal (+) thereof is coupled to the input terminal TD for receiving a test signal S11, and a selection terminal thereof is coupled to the test-enable terminal TE for receiving a selection signal STE. The multiplexer 100 generates an input signal S12 at its output terminal. The multiplexer 100 is controlled by the selection signal STE to selectively transmit the data signal S10 or the test signal S11 to the output terminal of the multiplexer 100 to serve as the input signal S12.

As shown in FIG. 1, the signal generation circuit 13 also receives the selection signal STE to generate another selection signal STEB which is the inverse of the selection signal STE. In the embodiment of FIG. 1, the signal generation circuit 13 comprises an inverter 130. The input terminal of the inverter 130 is coupled to the test-enable terminal TE for receiving the selection signal STE. Then, the inverter 130 inverts the selection signal STE to generate the selection signal STEB at the output terminal of the inverter 130. Thus, the selection signal STEB is the inverse of the selection signal STE. In other embodiments, the signal generation circuit 13 can be implemented by any other circuit structure which is capable of receiving the selection signal STE and generating the selection signal STEB which is the inverse of the selection signal STE.

The clock generation circuit 14 receives a clock signal SCK through the clock terminal CK to generate another clock signal SCKB which is the inverse of the clock signal SCK. In the embodiment of FIG. 1, the clock generation circuit 14 comprises an inverter 140. The input terminal of the inverter 140 is coupled to the clock terminal CK for receiving the clock signal SCK. Then, the inverter 140 inverts the clock signal SCK to generate the clock signal SCKB at the output terminal of the inverter 140. Thus, the clock signal SCKB is the inverse of the clock signal SCK. In other embodiments, the clock generation circuit 14 can be implemented by any other circuit structure which is capable of receiving the clock signal SCK and generating the clock signal SCKB which is the inverse of the clock signal SCK.

Referring to FIG. 1, the control circuit 11 receives the input signal S12. The control circuit 11 is controlled by the clock signals SCK and SCKB to generate control signals S13 and S14 for the scan-out stage circuit 12 and an output signal S15. In the embodiment of FIG. 1, the control circuit 11 comprises tri-state inverters 110, 112, and 116 inverters 111, 115, and 117 and a transmission gate 118. The input terminal of the tri-state inverter 110 is coupled to the output terminal of the multiplexer 100, and the output terminal thereof is coupled to a node N10. The tri-state inverter 110 is controlled by the clock signal SCKB generated by the clock generation circuit 14. The tri-state inverter 110 operates to perform signal inversion, only when the clock signal SCKB is at a high voltage level VH (shown in FIG. 2A). The input terminal of the inverter 111 is coupled to the node N10, and the output terminal thereof is coupled to a node N11. The input terminal of the tri-state inverter 112 is coupled to the node N11, and the output terminal thereof is coupled to the node N10. The tri-state inverter 112 is controlled by the clock signal SCK. The tri-state inverter 112 operates to perform signal inversion, only when the clock signal SCK is at the high voltage level VH. The inverter 111 and the tri-state inverter 112 form a latch circuit. The transmission gate 118 is composed of a P-type transistor 113 and an N-type transistor 114. In the embodiment, the transistors 113 and 114 are implemented by metal-oxide-semiconductor (MOS) transistors. Thus, the transistor 113 is a P-type metal-oxide-semiconductor (PMOS) transistor, while the transistor 114 is an N-type metal-oxide-semiconductor (NMOS) transistor. The gate electrode (also known as "control electrode") of the PMOS transistor 113 receives the clock signal SCKB, the source electrode thereof is coupled to the node N11, and the drain electrode thereof is coupled to a node N12. The gate electrode of the NMOS transistor 114 receives the clock signal SCK, the drain electrode thereof is coupled to the node N11, and the source electrode thereof is coupled to the node N12. The transmission gate 118 is controlled by the clock signals SCK and SCKB to generate a control signal S13 at the node N12 according to the signal at the node N11. The input terminal of the inverter 115 is coupled to the node N12, and the output terminal thereof is coupled to a node N13. The inverter 115 inverts the control signal S13 at the node N12 to generate another control signal S14 at the node N13. Accordingly, the control signal S14 is the inverse of the control signal S13. The input terminal of the tri-state inverter 116 is coupled to the node N13, and the output terminal thereof is coupled to the node N12. The tri-state inverter 116 is controlled by the clock signal SCK at the clock terminal CK. The tri-state inverter 116 operates to perform signal inversion, only when the clock signal SCKB is at the high voltage level VH. The inverter 115 and the tri-state inverter 116 form another latch circuit. The input terminal of the inverter 117 is coupled to the node N13, and the output terminal thereof is coupled to the data output terminal Q of the scan output flip-flop 1. The inverter 117 inverts the control signal S14 at the node N13 to generate an inverted signal. The inverted signal is transmitted to the data output terminal Q to serve as the output signal S15. Accordingly, the scan-out signal S15 is the inverse of the control signal S14.

As shown in FIG. 1, the scan-out stage circuit 12 receives the selection signal STEB. The scan-out stage circuit 12 is controlled by the control signals S13 and S14 to generate the scan-out signal S16 at a node N15. The scan-out signal S16 is transmitted to the scan output terminal SQ. The scan-out stage circuit 12 comprises three transistors 120-122. In the embodiment of FIG. 1, the transistor 120 is an NMOS transistor, while the transistors 121 and 122 are PMOS transistors. The gate electrode (also known as a "control electrode") of the NMOS transistor 120 is coupled to the node N13 to receive the control signal S14, the drain electrode thereof receives the selection signal STEB, and the source electrode thereof is coupled to the node N15. The gate electrode of the PMOS transistor 121 receives the control signal S13, the source electrode thereof receives the selection signal STEB, and the drain electrode thereof is coupled to the node N15. The NMOS transistor 120 and the PMOS transistor 121 form a transmission gate 123. The gate electrode of the PMOS transistor 122 is coupled to the node N13 to receive the control signal S14, the source electrode thereof is coupled to a power terminal T10, and the drain electrode thereof is coupled to the node N15. The power terminal T10 receives an operation voltage VDD of the scan output flip-flop 1, and the operation voltage VDD has a relatively high level. The node N15 is coupled to the scan output terminal SQ of the scan output flip-flop 1. The scan-out signal S16 generated at the node N15 is transmitted to the scan output terminal SQ.

Figure 2A:
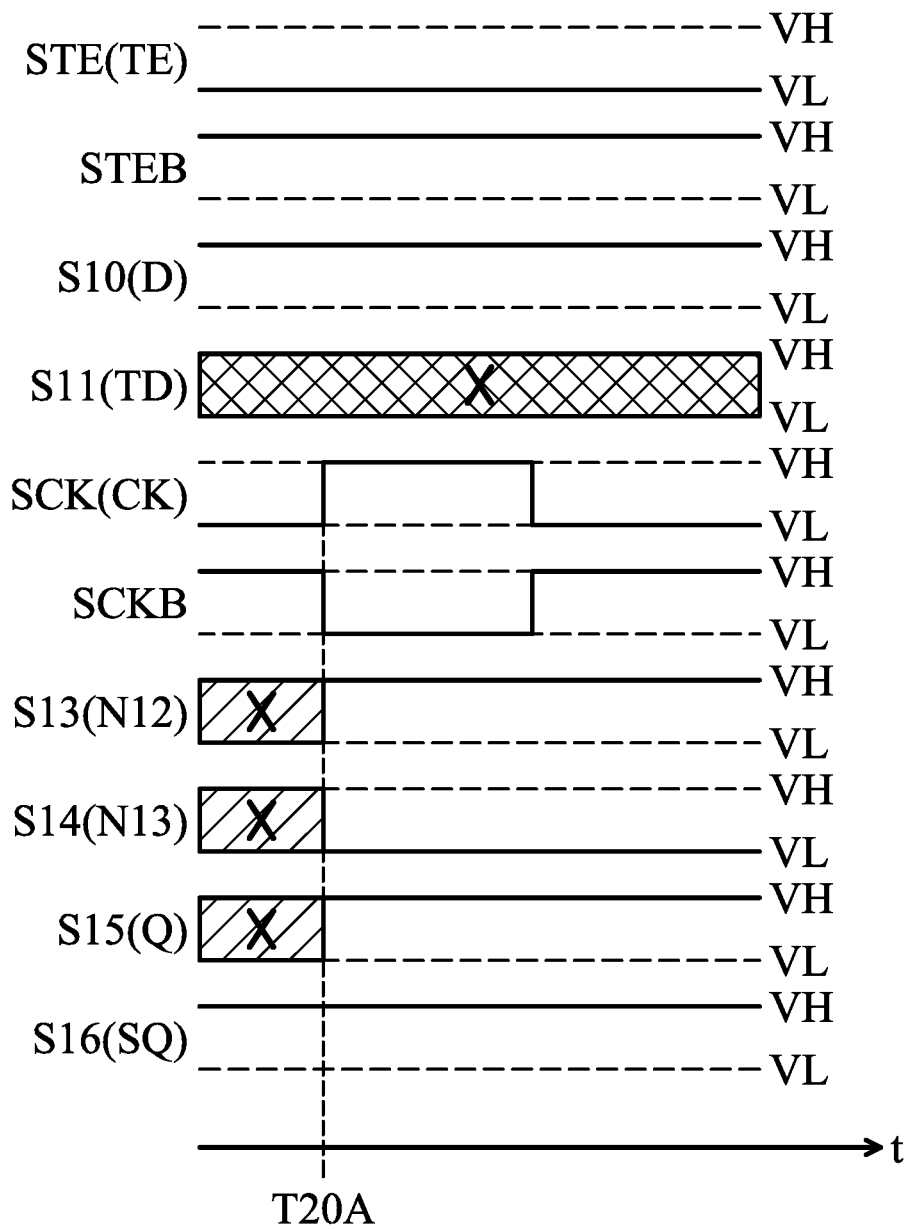
FIGS. 2A and 2B show one exemplary embodiment of the timing of the main signals of the scan output flip-flop shown in FIG. 1 in the normal mode.
Figure 2B:
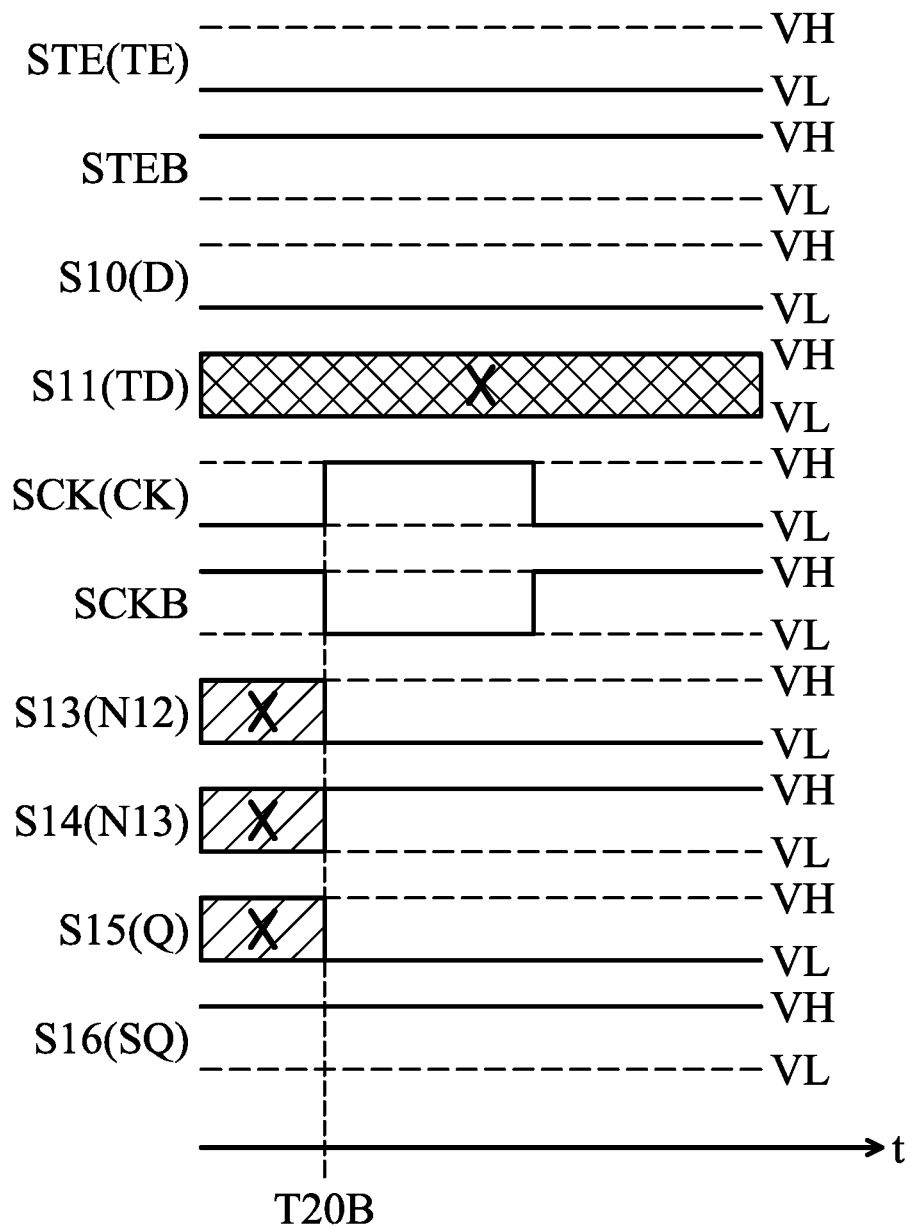
Figure 3A:
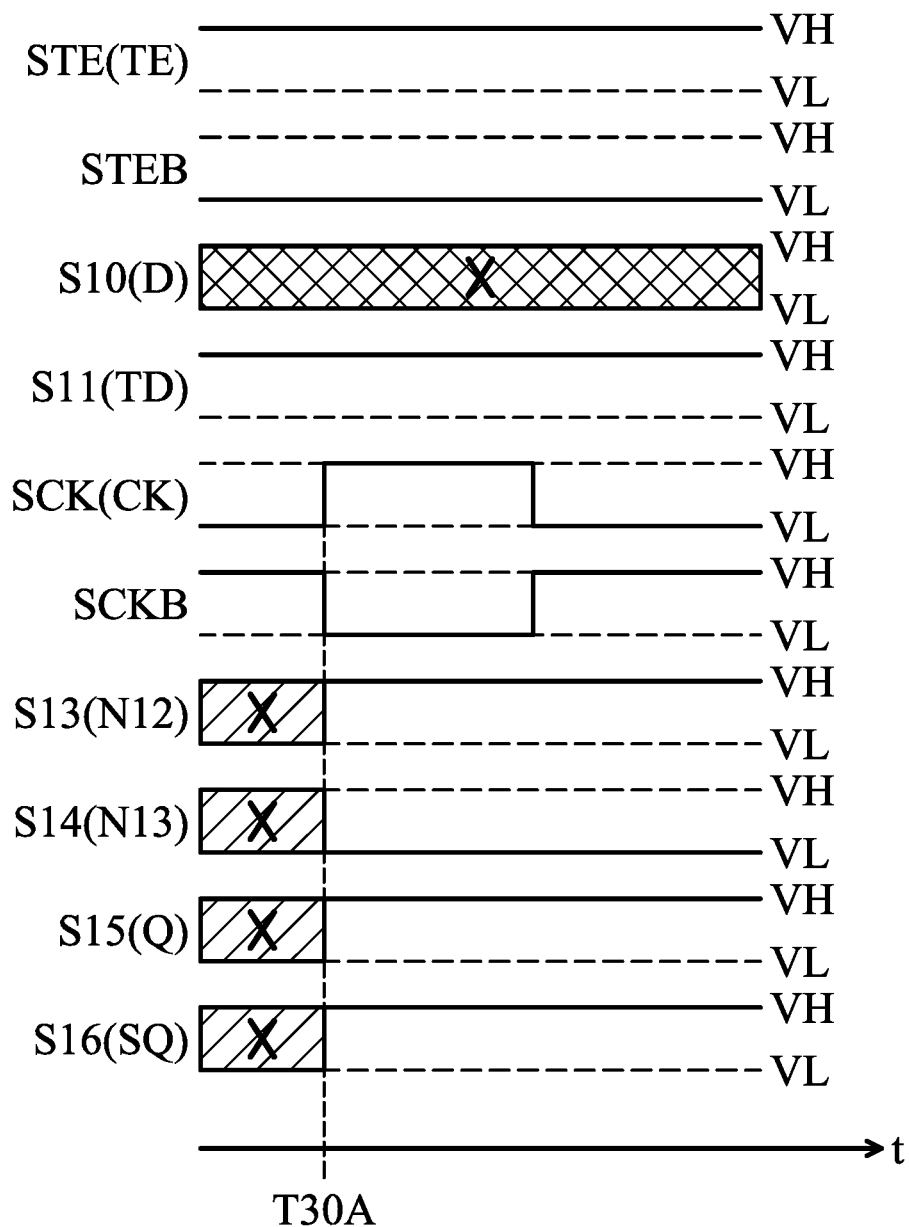
FIGS. 3A and 3B show one exemplary embodiment of the timing of the main signals of the scan output flip-flop shown in FIG. 1 in the test mode.
Figure 3B:
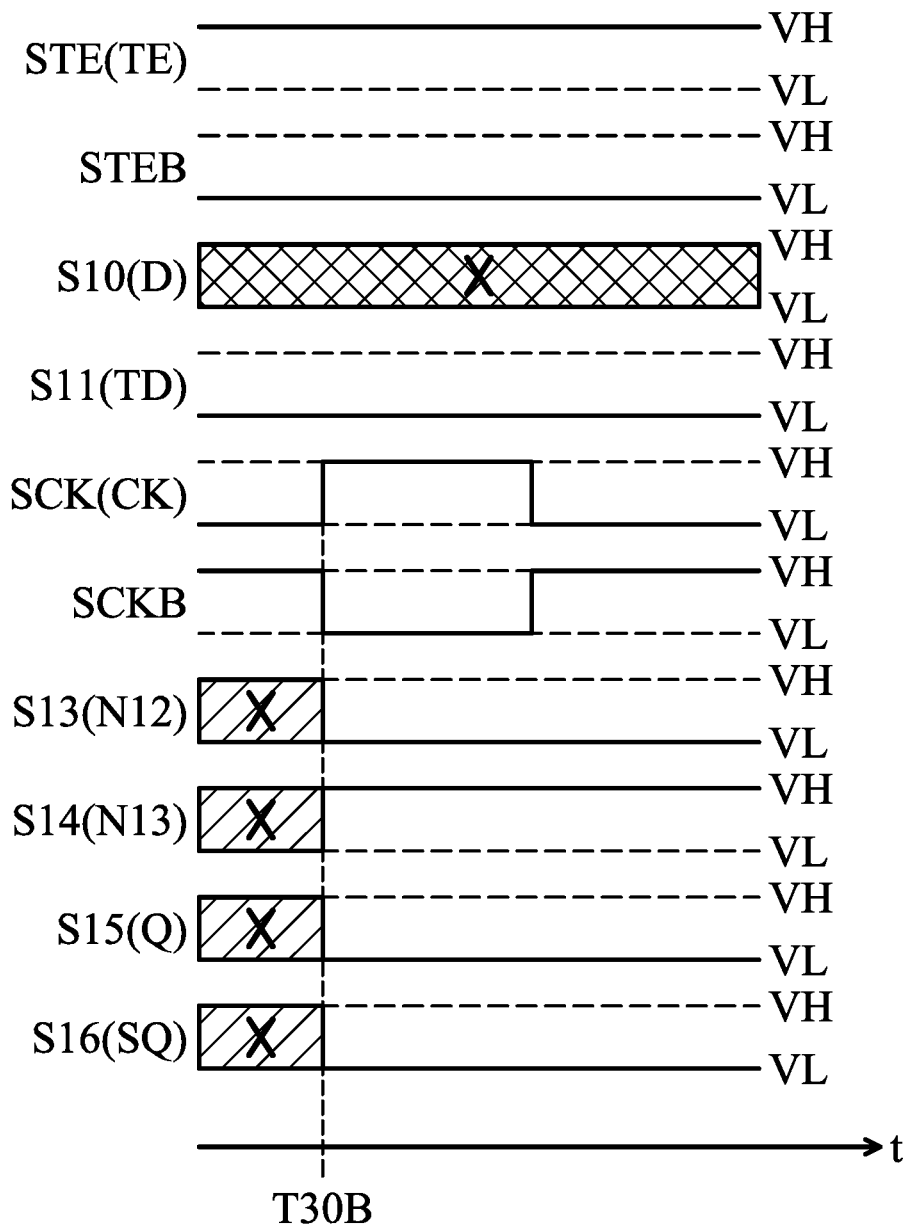

The scan output flip-flop 1 can selectively operate in a normal mode or a test mode in response to the selection signal STE. FIGS. 2A and 2B show one exemplary embodiment of the timing of the main signals of the scan output flip-flop 1 in the normal mode. FIGS. 3A and 3B show one exemplary embodiment of the timing of the main signals of the scan output flip-flop 1 in the test mode. In FIGS. 2A, 2B, 3A, and 3B, the contents in the brackets following the reference symbols of the signals indicate the corresponding terminals or nodes of the scan output flip-flop 1. For example, "STE (TE)" represents the selection signal STE and the test-enable terminal TE where the selection signal STE is. The operation of the scan output flip-flop 1 in the embodiment of FIG. 1 will be illustrated in later paragraphs by referring to FIGS. 1-3B.

Referring to FIGS. 1 and 2A-2B, when the selection signal STE is at the low voltage level VL, the scan output flip-flop 1 operates in the normal mode. Before time point T20A, the clock signal SCK is at a low voltage level VL, while the clock signal SCKB is at the high voltage level VH. The inverter 130 inverts the selection signal STE with the low voltage level VL to generate the selection signal STEB with the high voltage level VH. The multiplexer 100 selects the data signal S10 at the input terminal D and transmits the data signal S10 to its output terminal to serve as the input signal S12. In this case, since the test signal S11 is not selected, the test signal S11 is not considered for the operation of the scan output flip-flop 1 in the normal mode. In FIGS. 2A and 2B, the don't-care test signal S11 is represented by grid lines. In the embodiment of FIG. 2A, when the data signal S10 is at the high voltage level VH, through the tri-state inverter 110 and the inverter 111, the signal at the node N11 is also at the high voltage level VH. Since the transmission gate 118 is controlled by the clock signals SCK and SCKB, the transistors 113 and 114 are turned off by the clock signal SCK with the low voltage level VL and the clock signal SCKB with the high voltage level VH to turn off the transmission gate 118 until the clock signal SCK is switched to the high voltage level VH and the clock signal SCKB is switched to the low voltage level VL at time point T20A (that is, until the rising edge of the clock signal CK and the falling edge of the clock signal SCKB occur at time point T20A). Thus, before time point T20A, the control signals S13 and S14 and the output signal S15, which are present after the transmission gate 118, are not affected by the signal at the node N11. Specifically, before time point T20A, the control signals S13 and S14 and the output signal S15 are at the previous voltage levels (the high voltage level VH or the low voltage level VL) which were determined the last time that the rising edge of the clock signal CK and the falling edge of the clock signal SCKB occurred. In FIG. 2A, the portions of the signals S13-S15, which occur before time point T20A, are represented by oblique lines to indicate their previous voltage levels. Moreover, before time point T20A, depending on the voltage levels of the control signals S13 and 14, either the transmission gate 123 or the PMOS transistor 122 is turned on. Thus, the scan-out signal S16 has the high voltage level VH in response to the selection signal STEB with the high voltage level VH or the operation voltage VDD.

At time point T20A, the clock signal SCK is switched to the high voltage level VH and the clock signal SCKB is switched to the low voltage level VL. Thus, the transistors 113 and 114 are turned on. The control signal S13 is at the high voltage level VH in response to the signal at the node N11. The inverter 115 inverts the control signal S13 with the high voltage level VH to generate the control signal S14 with the low voltage level VL. The inverter 117 inverts the control signal S14 with the low voltage level VL to generate the output signal S15. Accordingly, the output signal S15 is at the high voltage level VH in response to the data signal S10 with the high voltage level VH. The NMOS transistor 120 is turned off by the control signal S14 with the low voltage level VL, and the PMOS transistor 121 is turned off by the control signal S13 with the high voltage level VH, so that the transmission gate 123 is turned off. Moreover, the PMOS transistor 122 is turned on by the control signal S14 with the low voltage level VL. Thus, the scan-out signal S16 is still at the high voltage level VH in response to the operation voltage VDD.

Referring to FIG. 2B, before time point T20B, the clock signal SCK is at the low voltage level VL, while the clock signal SCKB is at the high voltage level VH. In the normal mode, when the data signal S10 is at the low voltage level VL, through the tri-state inverter 110 and the inverter 111, the signal at the node N11 is also at the low voltage level VL. As described above, the transmission gate 118 is turned off until the clock signal SCK is switched to the high voltage level VH and the clock signal SCKB is switched to the low voltage level VL at time point T20B. Thus, before time point T20B, the control signals S13 and S14 and the output signal S15 are at the previous voltage levels (the high voltage level VH or the low voltage level VL) which were determined that last time that the rising edge of the clock signal CK and the falling edge of the clock signal SCKB occurred. In FIG. 2B, the portions of the signals S13-S15, which occur before time point T20B, are represented by oblique lines to indicate their previous voltage levels. Moreover, before time point T20B, depending on the voltage levels of the control signals S13 and 14, either the transmission gate 123 or the PMOS transistor 122 is turned on. Thus, the scan-out signal S16 has a high voltage level VH in response to the selection signal STEB with the high voltage level VH or the operation voltage VDD.

At time point T20B, the clock signal SCK is switched to the high voltage level VH and the clock signal SCKB is switched to the low voltage level VL. Thus, the transistors 113 and 114 are turned on. The control signal S13 is at the low voltage level VL in response to the signal at the node N11. The inverter 115 inverts the control signal S13 with the low voltage level VL to generate the control signal S14 with the high voltage level VH. The inverter 117 inverts the control signal S14 with the high voltage level VH to generate the output signal S15. Accordingly, the output signal S15 is at the low voltage level VL in response to the data signal S10 with the low voltage level VL. The PMOS transistor 122 is turned off by the control signal S14 with the high voltage level VH. Moreover, the NMOS transistor 120 is turned on by the control signal S14 with the high voltage level VH, and the PMOS transistor 121 is turned on by the control signal S13 with the low voltage level VL, so that the transmission gate 123 is turned on. Thus, the scan-out signal S16 is still at the high voltage level VH in response to the selection signal STEB with the high voltage level VH.

According to the above embodiment, in the normal mode, the voltage level of the output signal S15 varies with the variation in the voltage level of the data signal S10. However, in the normal mode, the scan-out signal S16 is fixed at the high voltage level VH no matter what the voltage level of the data signal S10 is.

Referring to FIGS. 1 and 3A-3B, when the selection signal STE is at the high voltage level VH, the scan output flip-flop 1 operates in the test mode. Before time point T30A, the clock signal SCK is at the low voltage level VL, while the clock signal SCKB is at the high voltage level VH. The inverter 130 inverts the selection signal STE with the high voltage level VH to generate the selection signal STEB with the low voltage level VL. The multiplexer 100 selects the test signal S11 at the input terminal TD and transmits the test signal S11 to its output terminal to serve as the input signal S12. In this case, since the data signal S10 is not selected, the data signal S10 is not considered for the operation of the scan output flip-flop 1 in the test mode. In FIGS. 3A and 3B, the don't-care data signal S10 is represented by grid lines. In the embodiment of FIG. 3A, when the test signal S11 is at the high voltage level VH, through the tri-state inverter 110 and the inverter 111, the signal at the node N11 is also at the high voltage level VH. Since the transmission gate 118 is controlled by the clock signals SCK and SCKB, the transistors 113 and 114 are turned off by the clock signal SCK with the low voltage level VL and the clock signal SCKB with the high voltage level VH to turn off the transmission gate 118 until the clock signal SCK is switched to the high voltage level VH and the clock signal SCKB is switched to the low voltage level VL at time point T30A (that is, until the rising edge of the clock signal CK and the falling edge of the clock signal SCKB occur at time point T30A). Thus, before time point T30A, the control signals S13 and S14 and the output signal S15, which are present after the transmission gate 118, are not affected by the signal at the node N11. Specifically, before time point T30A, the control signals S13 and S14 and the output signal S15 are at the previous voltage levels (the high voltage level VH or the low voltage level VL) which were determined the last time that the rising edge of the clock signal CK and the falling edge of the clock signal SCKB occurred. In FIG. 3A, the portions of the signals S13-S15, which occur before time point T30A are represented by oblique lines to indicate their previous voltage levels. Moreover, before time point T30A, depending on the voltage levels of the control signals S13 and 14, either the transmission gate 123 or the PMOS transistor 122 is turned on. Thus, the scan-out signal S16 has the high voltage level VH in response to the operation voltage VDD through the turned-on PMOS transistor 122 or the low voltage level VL in response to the selection signal STEB with the low voltage level VL through the turned-on transmission gate 123. Since the scan-out signal S16 may be at the high voltage level VH or the low voltage level VL before time point T30A, the portion of the scan-out signal S16, which occurs before time point T30A, is represented by oblique lines to indicate its undetermined voltage levels.

At time point T30A, the clock signal SCK is switched to the high voltage level VH and the clock signal SCKB is switched to the low voltage level VL. Thus, the transistors 113 and 114 are turned on. The control signal S13 is at the high voltage level VH in response to the signal at the node N11. The inverter 115 inverts the control signal S13 with the high voltage level VH to generate the control signal S14 with the low voltage level VL. The inverter 117 inverts the control signal S14 with the low voltage level VL to generate the output signal S15. Accordingly, the output signal S15 is at the high voltage level VH in response to the test signal S11 with the high voltage level VH. The NMOS transistor 120 is turned off by the control signal S14 with the low voltage level VL, and the PMOS transistor 121 is turned off by the control signal S13 with the high voltage level VH, so that the transmission gate 123 is turned off. Moreover, the PMOS transistor 122 is turned on by the control signal S14 with the low voltage level VL. Thus, the scan-out signal S16 is at the high voltage level VH in response to the operation voltage VDD.

Referring to FIG. 3B, before time point T30B, the clock signal SCK is at the low voltage level VL, while the clock signal SCKB is at the high voltage level VH. In the test mode, when the test signal S11 is at the low voltage level VL, through the tri-state inverter 110 and the inverter 111, the signal at the node N11 is also at the low voltage level VL. As described above, the transmission gate 118 is turned off until the clock signal SCK is switched to the high voltage level VH and the clock signal SCKB is switched to the low voltage level VL at time point T30B. Thus, before time point T30B, the control signals S13 and S14 and the output signal S15 are at the previous voltage levels (the high voltage level VH or the low voltage level VL) which were determined the last time that the rising edge of the clock signal CK and the falling edge of the clock signal SCKB occurred. In FIG. 3B, the portions of the signals S13-S15, which occur before time point T30B, are represented by oblique lines to indicate their previous voltage levels. Moreover, before time point T30B, depending on the voltage levels of the control signals S13 and 14, either the transmission gate 123 or the PMOS transistor 122 is turned on. Thus, the scan-out signal S16 has the high voltage level VH in response to the operation voltage VDD through the turned-on PMOS transistor 122 or the low voltage level VL in response to the selection signal STEB with the low voltage level VL through the turned-on transmission gate 123. Since the scan-out signal S16 may be at the high voltage level VH or the low voltage level VL before time point T30B, the portion of the scan-out signal S16, which occur before time point T30B, is represented by oblique lines to indicate its undetermined voltage levels.

At time point T30B, the clock signal SCK is switched to the high voltage level VH and the clock signal SCKB is switched to the low voltage level VL. Thus, the transistors 113 and 114 are turned on. The control signal S13 is at the low voltage level VL in response to the signal at the node N11. The inverter 115 inverts the control signal S13 with the low voltage level VL to generate the control signal S14 with the high voltage level VH. The inverter 117 inverts the control signal S14 with the high voltage level VH to generate the output signal S15. Accordingly, the output signal S15 is at the low voltage level VL in response to the data signal S11 with the low voltage level VL. The PMOS transistor 122 is turned off by the control signal S14 with the high voltage level VH. Moreover, the NMOS transistor 120 is turned on by the control signal S14 with the high voltage level VH, and the PMOS transistor 121 is turned on by the control signal S13 with the low voltage level VL, so that the transmission gate 123 is turned on. Thus, the scan-out signal S16 is at the low voltage level VL in response to the selection signal STEB with the low voltage level VL.

According to the above embodiment, in the test mode, not only does the voltage level of the output signal S15 vary with the variation in the voltage level of the test signal S11, but the voltage level of the scan-out signal S16 also varies with the variation in the voltage level of the test signal S11.

In the embodiment of FIG. 1, the scan-out stage circuit 12 which is used to control the voltage level of the scan-out signal S16 comprises only three transistors. Thus, the scan-out stage circuit 12 occupies a smaller area in the scan output flip-flop 1.

Figure 4:
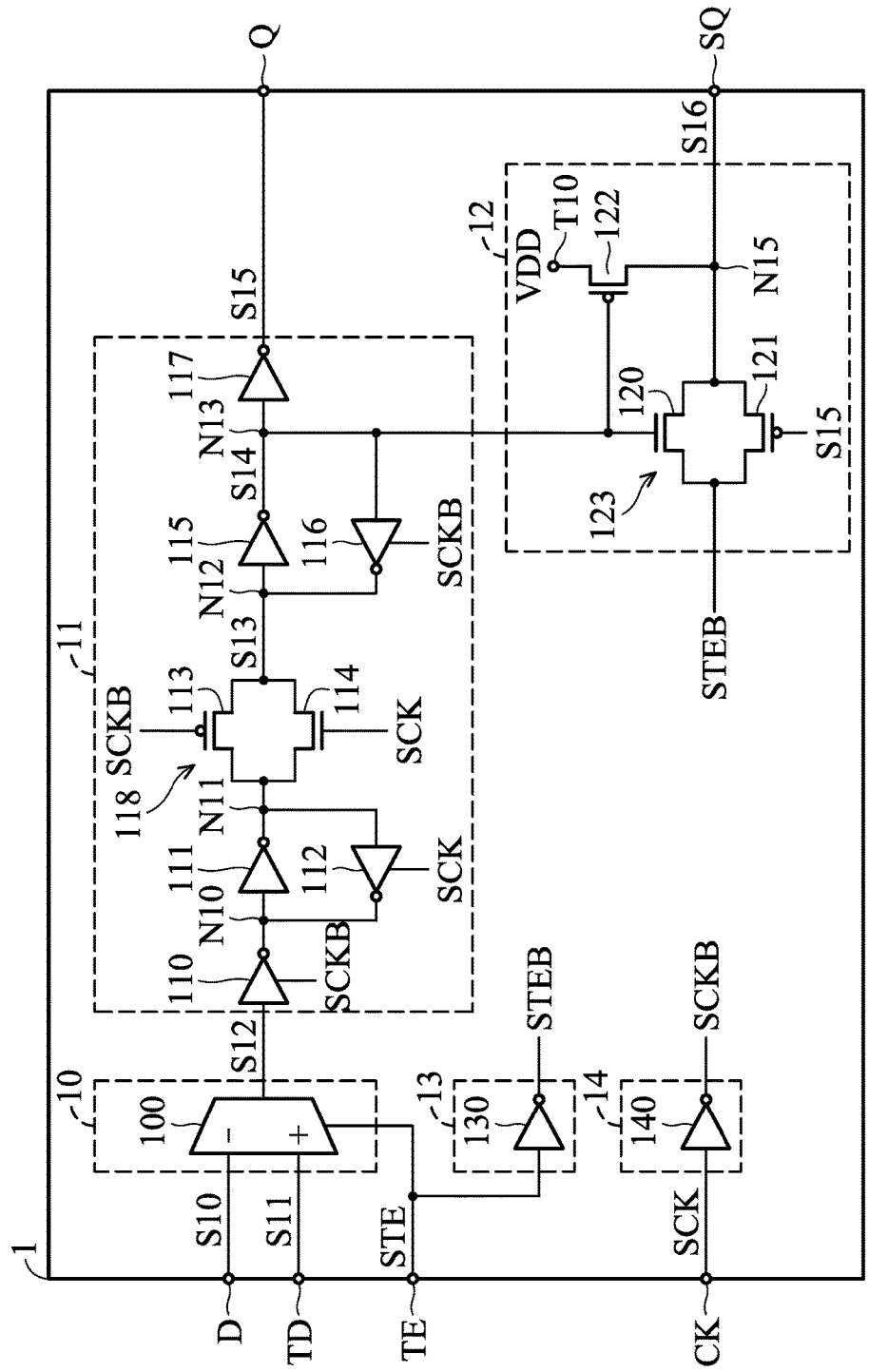
FIG. 4 shows another exemplary embodiment of a scan output flip-flop.

Referring to FIGS. 2A-3B, in each of the normal mode and test mode, the voltage level of the control signal S13 is the same as the voltage level of the output signal S15. Thus, in other embodiments, as shown in FIG. 4, the output signal S15 is another control signal which is generated by the control circuit 11 and transmitted to the gate electrode of the PMOS transistor 121. The operation of the PMOS transistor 121 controlled by the output signal S15 in the embodiment of FIG. 4 is the same as the operation of the PMOS transistor 121 controlled by the control signal S13 in the embodiment of FIG. 1. Moreover, the timing of the main signals of the scan output flip-flop 1 in the embodiment of FIG. 4 is the same as the timing the main signals of the scan output flip-flop 1 in the embodiment of FIG. 1. Thus, the related operations of the elements of the scan output flip-flop 1 shown in FIG. 4 are omitted here.

Figure 5:
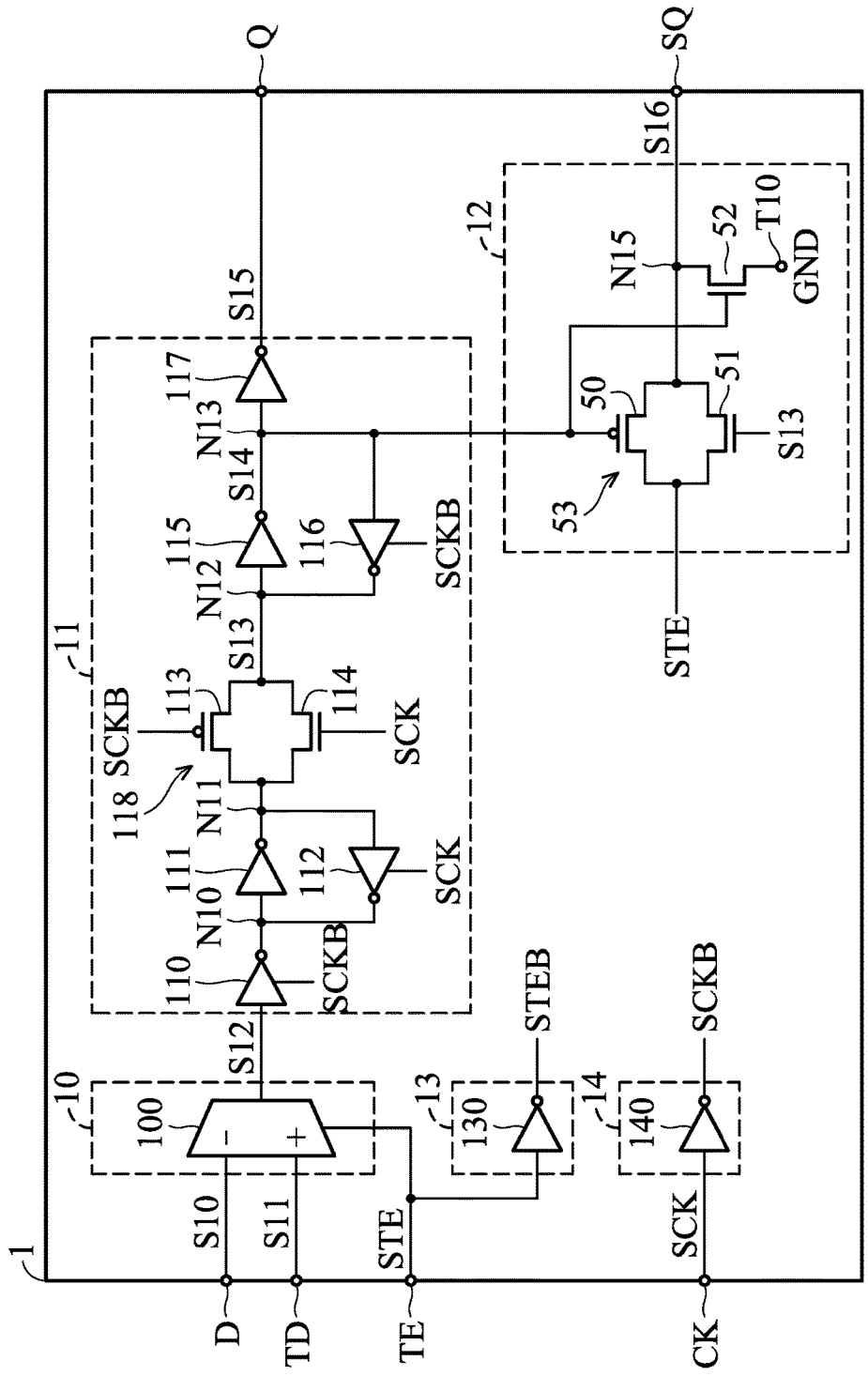
FIG. 5 shows another exemplary embodiment of a scan output flip-flop.

According to the embodiment of FIG. 1, the scan-out stage circuit 12 comprises one NMOS transistor 120 and two PMOS transistors 121 and 122. In other embodiments, as shown in FIG. 5, the scan-out stage circuit 12 comprises one PMOS transistor 50 and two NMOS transistors 51 and 52. Referring to FIG. 5, the scan-out stage circuit 12 receives the selection signal STE instead of the selection STEB of the embodiment FIG. 1. The gate electrode of the PMOS transistor 50 is coupled to the node N13 to receive the control signal S14, the source electrode thereof receives the selection signal STE, and the drain electrode thereof is coupled to the node N15. The gate electrode of the NMOS transistor 51 receives the control signal S13, the drain electrode thereof receives the selection signal STE, and the source electrode thereof is coupled to the node N15. The PMOS transistor 50 and the NMOS transistor 51 form a transmission gate 53. The gate electrode of the NMOS transistor 52 is coupled to the node N13 to receive the control signal S14, the drain electrode thereof is coupled to the node N15, and the source electrode thereof is coupled to the power terminal T10. In the embodiment of FIG. 5, the power terminal T10 receives a ground voltage GND of the scan output flip-flop 1, and the ground voltage GND has a relative low level.

Figure 6A:
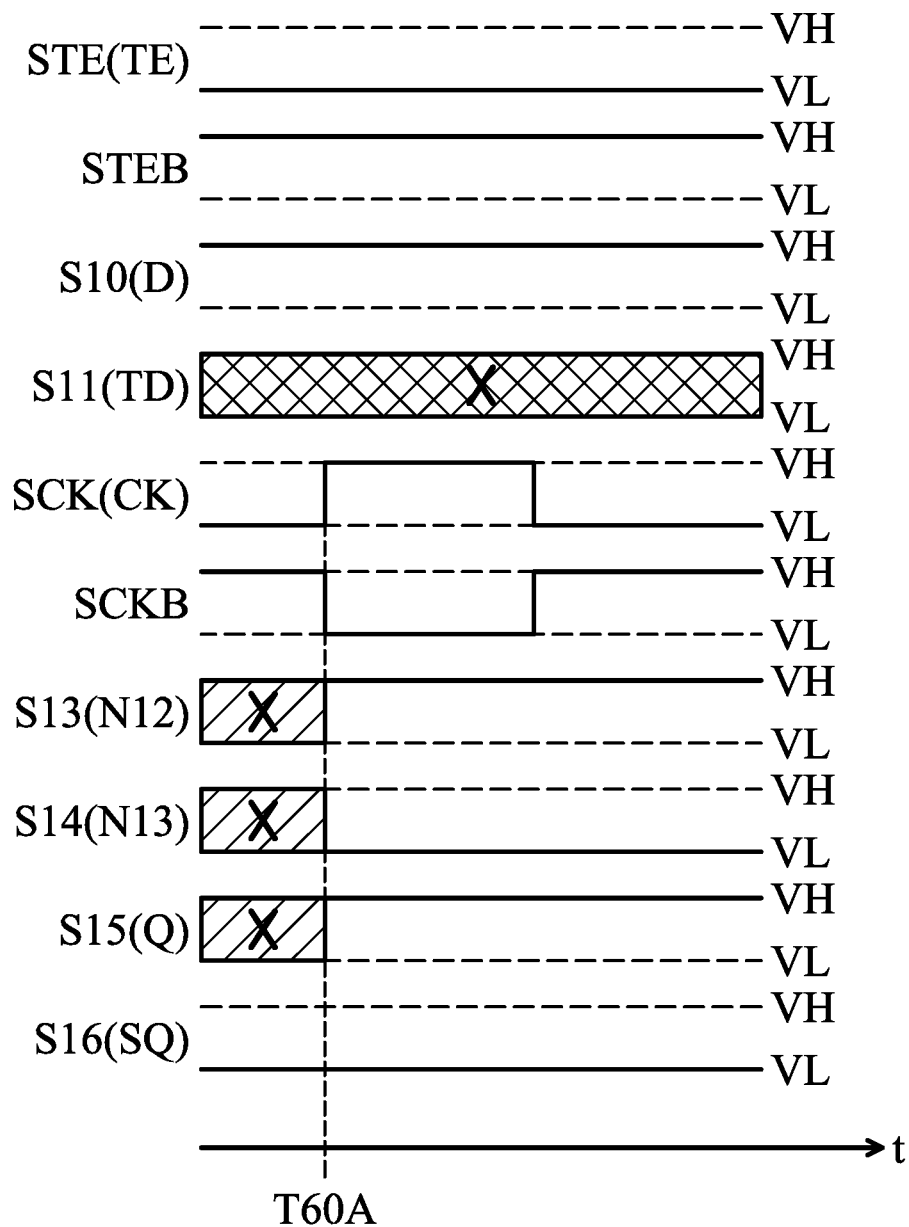
FIGS. 6A and 6B show an exemplary embodiment of the timing of the main signals of the scan output flip-flop shown in FIG. 5 in the normal mode.
Figure 6B:
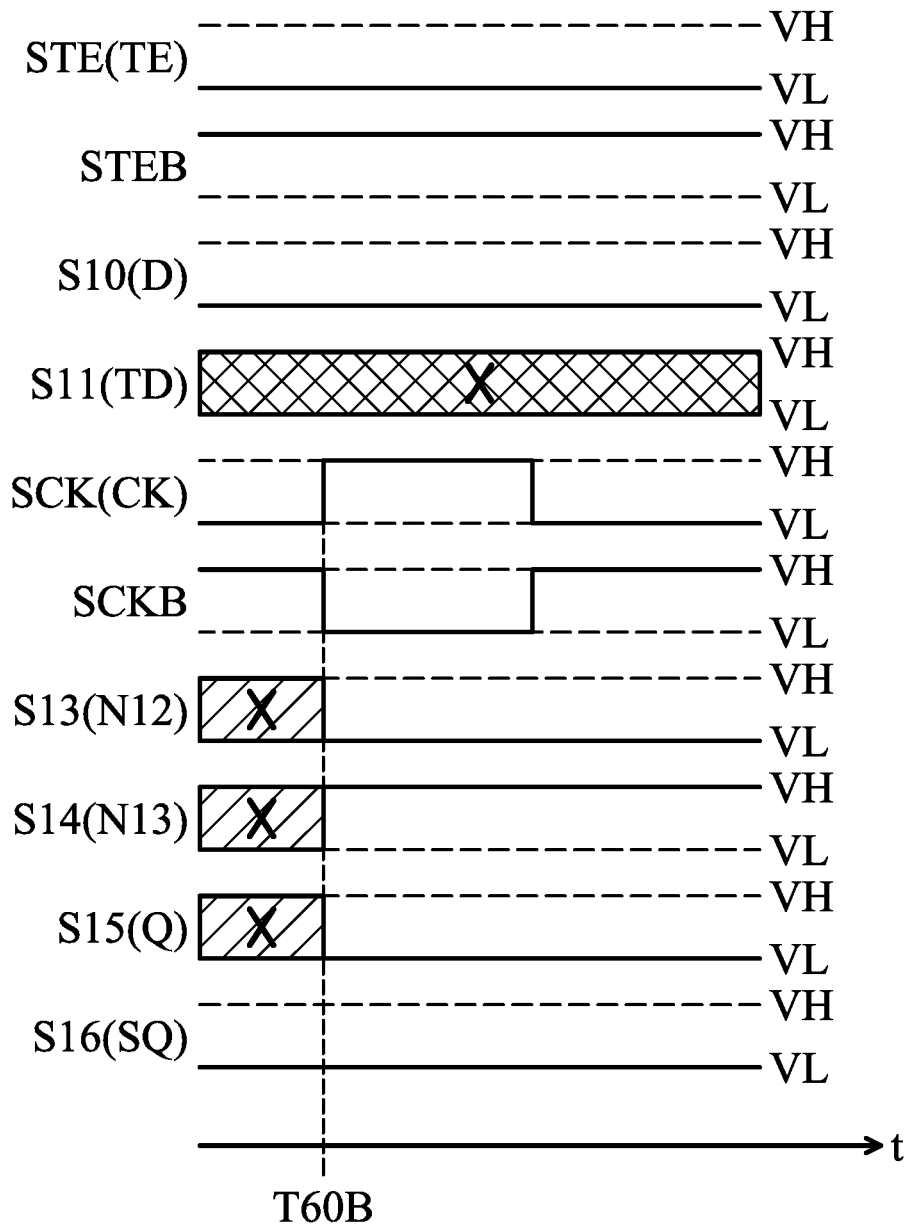
Figure 7A:
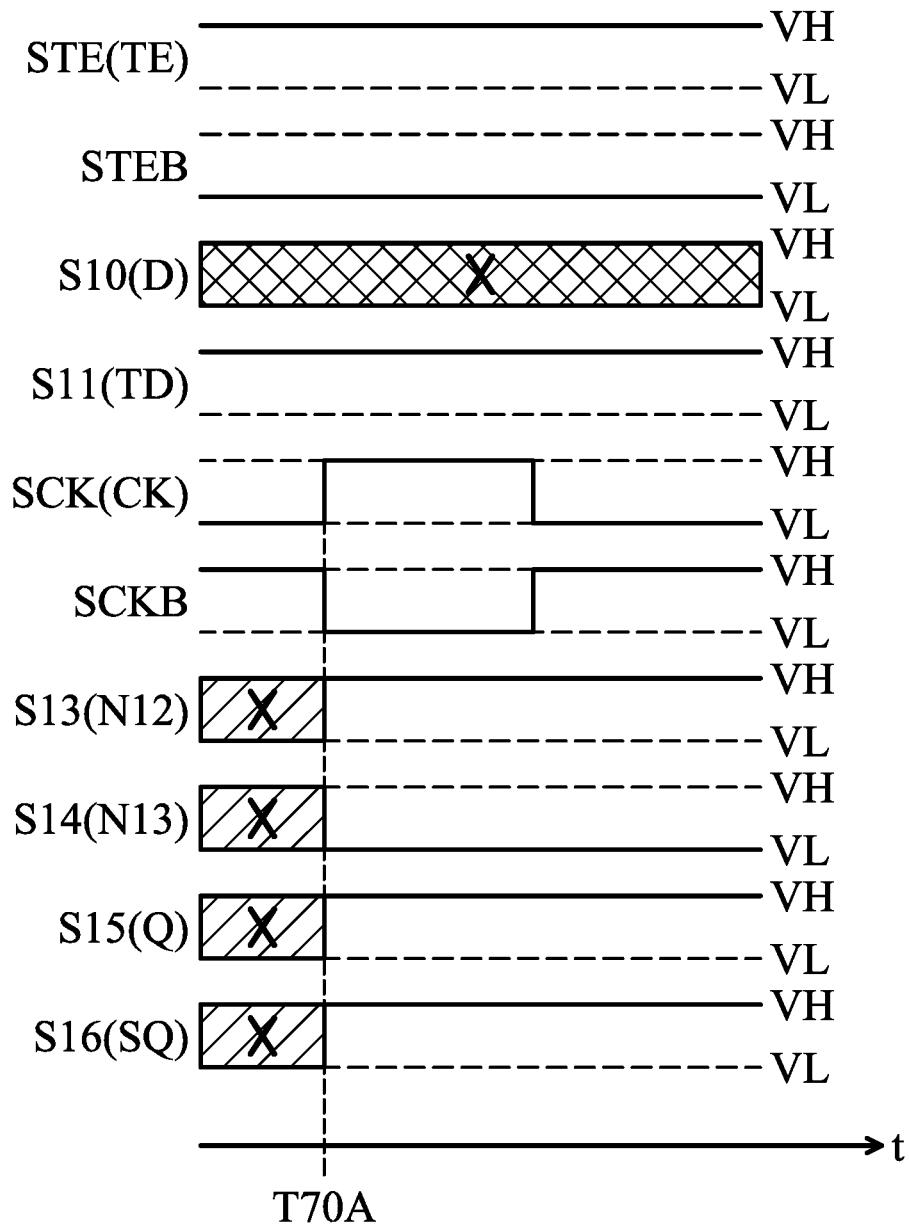
FIGS. 7A and 7B shows another exemplary embodiment of the timing of the main signals of the scan output flip-flop shown in FIG. 5 in the test mode.
Figure 7B:
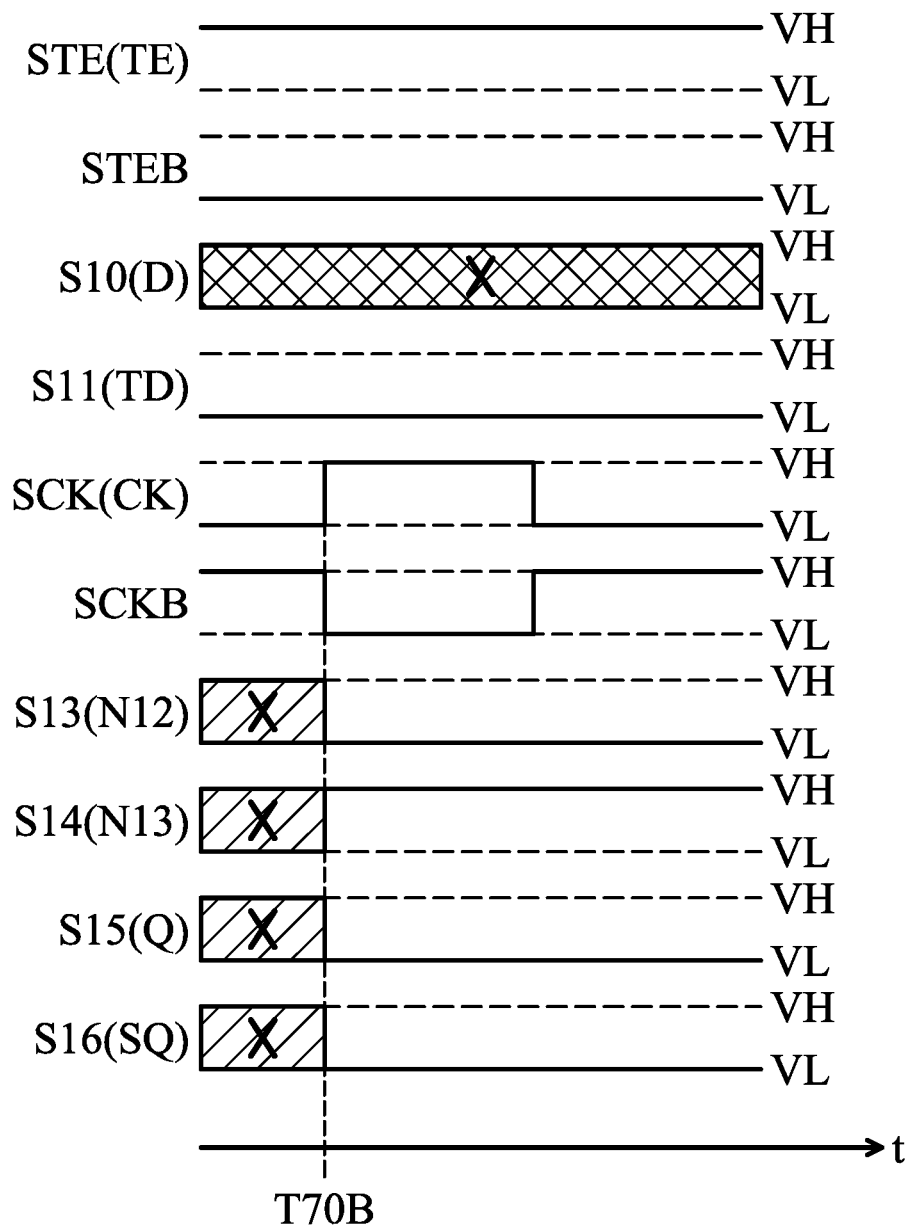

FIGS. 6A and 6B show another exemplary embodiment of the timing of the main signals of the scan output flip-flop 1 in the normal mode. FIGS. 7A and 7B show another exemplary embodiment of the timing of the main signals of the scan output flip-flop 1 in the test mode. In FIGS. 6A, 6B, 7A, and 7B, the contents in the brackets following the reference symbols of the signals indicate the corresponding terminals or nodes of the scan output flip-flop 1. The operation of the scan output flip-flop 1 in the embodiment of FIG. 5 will be illustrated in later paragraphs by referring to FIGS. 5-7B.

Referring to FIG. 5, except the scan-out stage circuit 12, the structures of the selection circuit 10, the control circuit 11, the signal generation circuit 13, and the clock generation circuit 14 in the embodiment of FIG. 5 are the same as those in the embodiment of FIG. 1. Moreover, the timing of the signals STE, STEB, S10, S12, SCK, SCKB, S13, S14, and S15 which are received or generated by the selection circuit 10, the control circuit 11, the signal generation circuit 13, and the clock generation circuit 14 in the embodiment of FIGS. 6A-7B is the same as that in the embodiment of FIG. 2A-3B. Thus, the description of the operation of the selection circuit 10, the control circuit 11, the signal generation circuit 13, and the clock generation circuit 14 in the embodiment of FIG. 5 is omitted here.

Referring to FIGS. 6A and 6B, when the selection signal STE is at the low voltage level VL, the scan output flip-flop 1 operates in the normal mode. In the normal mode, when the data signal S10 is at the high voltage level VH as shown in FIG. 6A, either the transmission gate 53 or the NMOS transistor 52 is turned on depending on the voltage levels of the control signals S13 and 14 before time point T60A. Thus, the scan-out signal S16 has the low voltage level VL in response to the selection signal STE with the low voltage level VL or the ground voltage GND.

At time point T60A, in response to the rising edge of the clock signal SCK and the falling edge of the clock signal SCKB, the control signal S13 is at the high voltage level VH, while the control signal S14 is at the low voltage level VL. The NMOS transistor 52 is turned off by the control signal S14 with the low voltage level VL. Moreover, the PMOS transistor 50 is turned on by the control signal S14 with the low voltage level VL, and the NMOS transistor 51 is turned on by the control signal S13 with the high voltage level VH, so that the transmission gate 123 is turned on. Thus, the scan-out signal S16 is still at the low voltage level VL in response to the selection signal STE with the low voltage level VL.

Referring to FIG. 6B, in the normal mode, when the data signal S10 is at the low voltage level VL, either the transmission gate 123 or the PMOS transistor 122 is turned on depending on the voltage levels of the control signals S13 and 14 before time point T60B. Thus, the scan-out signal S16 has the low voltage level VL in response to the selection signal STE with the low voltage level VL or the ground voltage GND.

At time point T60B, in response to the rising edge of the clock signal SCK and the falling edge of the clock signal SCKB, the control signal S13 is at the low voltage level VL, while the control signal S14 is at the high voltage level VH. The PMOS transistor 50 is turned off by the control signal S14 with the high voltage level VH, and the NMOS transistor 51 is turned off by the control signal S13 with the low voltage level VL, so that the transmission gate 533 is turned off. Moreover, the NMOS transistor 52 is turned on by the control signal S14 with the high voltage level VH. Thus, the scan-out signal S16 is still at the low voltage level VL in response to the ground voltage with the low voltage level VL.

According to the above embodiment, in the normal mode, the voltage level of the output signal S15 varies with the variation in the voltage level of the data signal S10. However, in the normal mode, the scan-out signal S16 is fixed at the low voltage level VL no matter what the voltage level of the data signal S10 is.

Referring to FIGS. 5 and 7A-7B, when the selection signal STE is at the high voltage level VH, the scan output flip-flop 1 operates in the test mode. In the test mode, when the test signal S11 is at the high voltage level VH as shown in FIG. 7A, either the transmission gate 53 or the PMOS transistor 122 is turned on depending on the voltage levels of the control signals S13 and 14 before time point T70A. Thus, the scan-out signal S16 has the low voltage level VL in response to the ground voltage GND through the turned-on NMOS transistor 52 or the high voltage level VH in response to the selection signal STE with the high voltage level VH through the turned-on transmission gate 53. Since the scan-out signal S16 may be at the high voltage level VH or the low voltage level VL before time point T70A, the portion of the scan-out signal S16, which occur before time point T70A, is represented by oblique lines to indicate its undetermined voltage levels.

At time point T70A, in response to the rising edge of the clock signal SCK and the falling edge of the clock signal SCKB, the control signal S13 is at the high voltage level VH, while the control signal S14 is at the low voltage level VL. The NMOS transistor 52 is turned off by the control signal S14 with the low voltage level VL. Moreover, the PMOS transistor 50 is turned on by the control signal S14 with the low voltage level VL, and the NMOS transistor 52 is turned on by the control signal S13 with the high voltage level VH, so that the transmission gate 53 is turned on. Thus, the scan-out signal S16 is at the high voltage level VH in response to the operation voltage VDD.

Referring to FIG. 7B, in the test mode, when the test signal S11 is at the low voltage level VL, either the transmission gate 53 or the NMOS transistor 52 is turned on depending on the voltage levels of the control signals S13 and 14 before time point T70B. Thus, the scan-out signal S16 has the low voltage level VL in response to the ground voltage GND through the turned-on NMOS transistor 52 or the high voltage level VH in response to the selection signal STE with the high voltage level VH through the turned-on transmission gate 53. Since the scan-out signal S16 may be at the high voltage level VH or the low voltage level VL before time point T70B, the portion of the scan-out signal S16, which occur before time point T70B, is represented by oblique lines to indicate its undetermined voltage levels.

At time point T70B, in response to the rising edge of the clock signal SCK and the falling edge of the clock signal SCKB, the control signal S13 is at the low voltage level VL, while the control signal S14 is at the high voltage level VH. The PMOS transistor 50 is turned off by the control signal S14 with the high voltage level VH, and the NMOS transistor 51 is turned off by the control signal S13 with the low voltage level VL, so that the transmission gate 53 is turned off. Moreover, the NMOS transistor 52 is turned on by the control signal S14 with the high voltage level VH. Thus, the scan-out signal S16 is at the low voltage level VL in response to the ground voltage with the low voltage level VL.

According to the above embodiment, in the test mode, not only is the voltage level of the output signal S15 determined by the voltage level of the test signal S11, but the voltage level of the scan-out signal S16 also varies with the variation in the voltage level of the test signal S11. Referring to FIGS. 3A-3B and 7A-7B, the timing of the scan-out signal S16 in the test mode according to the embodiment of FIG. 5 is also the same as that in the test mode according to the embodiment of FIG. 1.

In the embodiment of FIG. 5, the scan-out stage circuit 12 which is used to control the voltage level of the scan-out signal S16 comprises only three transistors. Thus, the scan-out stage circuit 12 occupies a smaller area in the scan output flip-flop 1.

Figure 8:
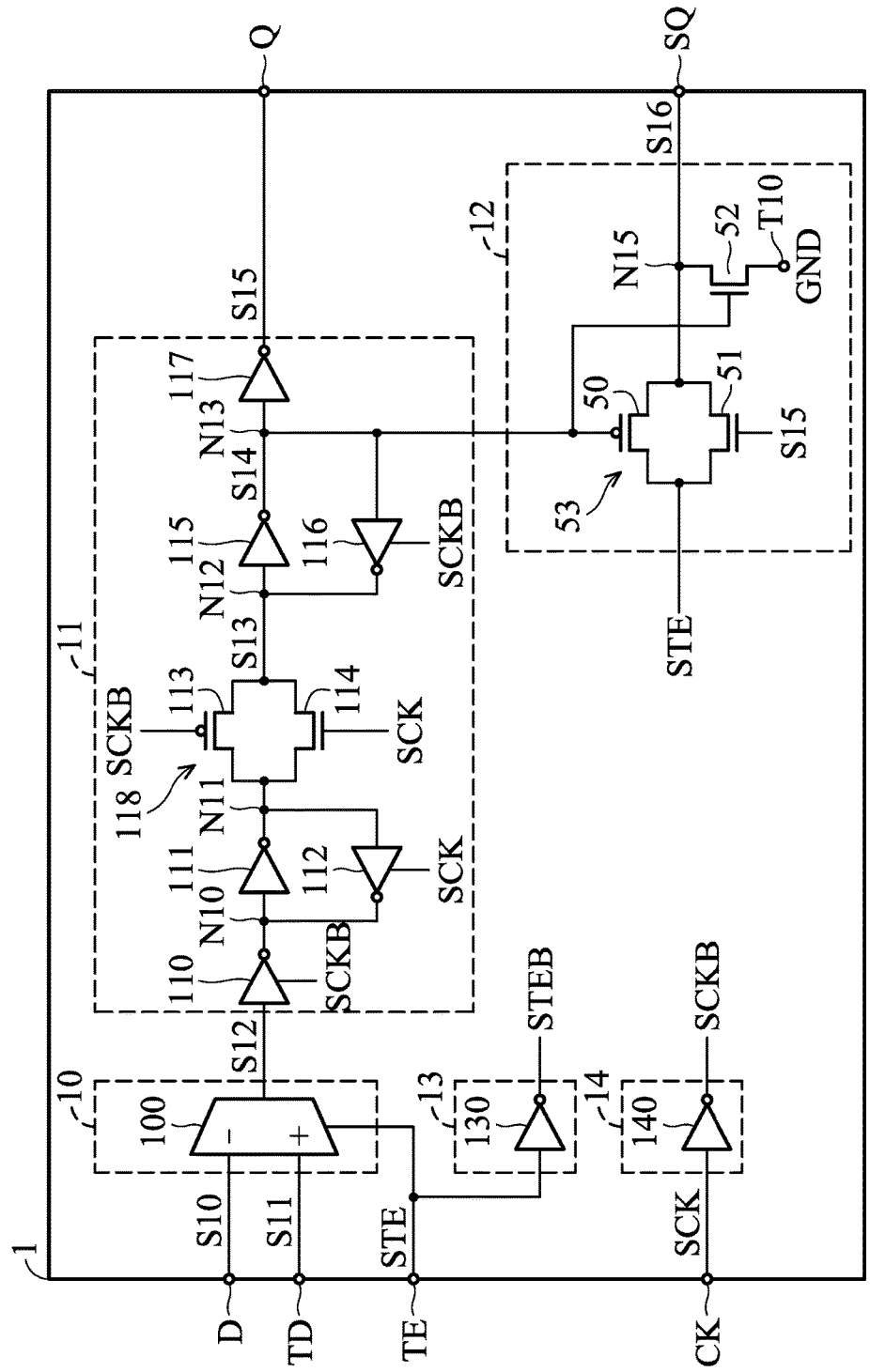
FIG. 8 shows another exemplary embodiment of a scan output flip-flop.

Referring to FIGS. 6A-7B, in each of the normal mode and test mode, the voltage level of the control signal S13 is the same as the voltage level of the output signal S15. Thus, in other embodiments, as shown in FIG. 8, the output signal S15 is another control signal which is generated by the control circuit 11 and transmitted to the gate electrode of the PMOS transistor 51. The operation of the PMOS transistor 51 controlled by the output signal S15 in the embodiment of FIG. 8 is the same as the operation of the PMOS transistor 51 controlled by the control signal S13 in the embodiment of FIG. 5. Moreover, the timing of the main signals of the scan output flip-flop 1 in the embodiment of FIG. 8 is the same as the timing the main signals of the scan output flip-flop 1 in the embodiment of FIG. 5. Thus, the related operations of the elements of the scan output flip-flop 1 shown in FIG. 8 are omitted here.

Figure 9:
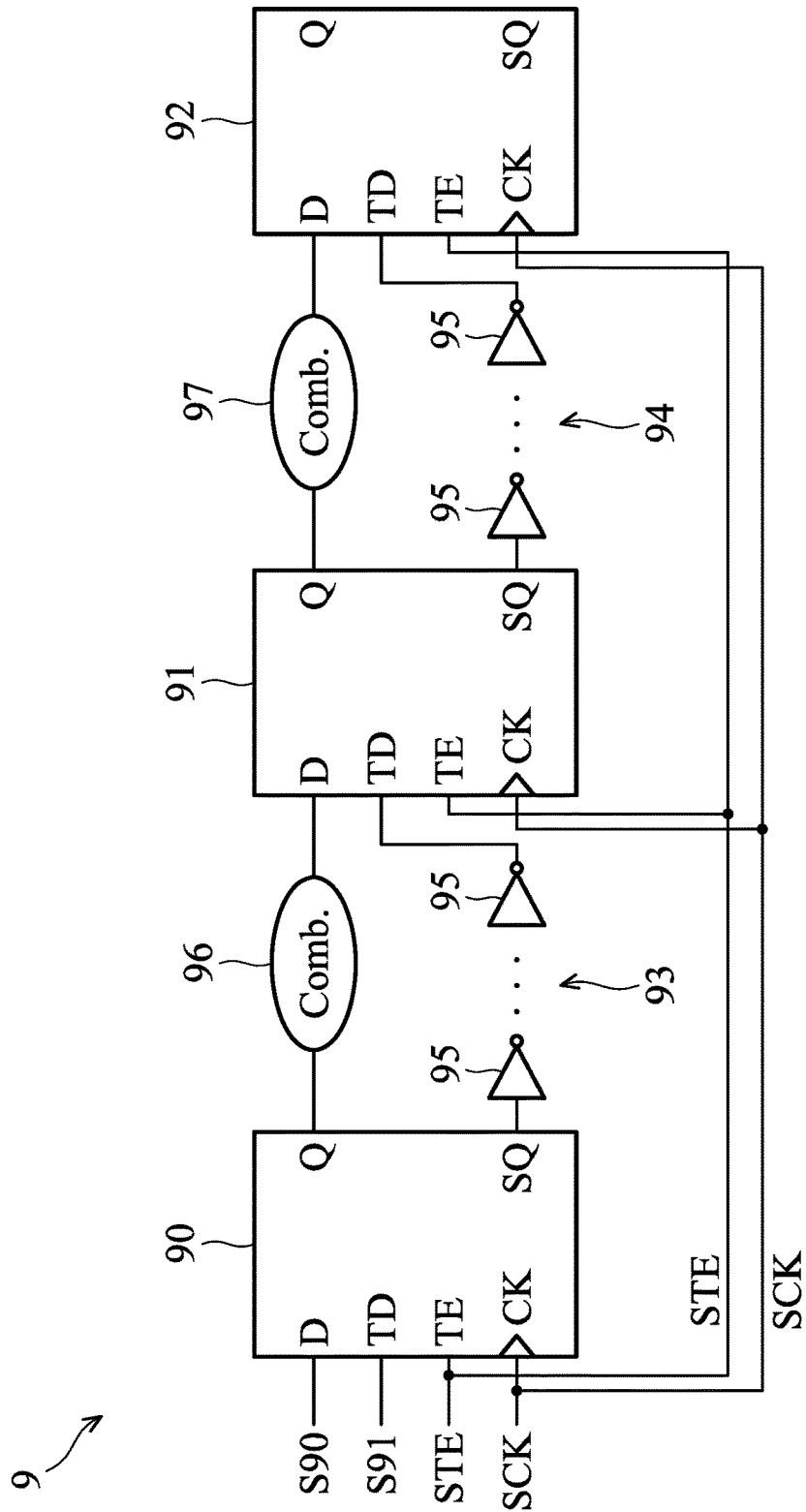
FIG. 9 shows an exemplary embodiment of a scan chain.

FIG. 9 shows an exemplary embodiment of a scan chain. As shown in FIG. 9, a scan chain 9 comprises a plurality of scan output flip-flops, at least one delay chain coupled between two scan output flip-flops, at least one combinatorial logic block coupled between two scan output flip-flops. In the embodiment of FIG. 9, three scan output flip-flops 90-92, two delay chains 93 and 94, and two combinatorial logic blocks 96 and 97 are given as an example. Each delay chain comprises a plurality of buffers, such as inverters 95. The scan chain 9 performs scan testing to detect any manufacturing fault in these combinatorial logic blocks 96 and 97. Each of the scan output flip-flops 90-92 has the same circuit structure in the embodiment of FIG. 1, 4, 5, or 8. The test-enable terminal TE of each of the scan output flip-flops 90-92 receives the same selection signal, that is, the selection signal STE. The clock input terminal CK of each of the scan output flip-flops 90-92 receives the same clock signal, that is, the clock signal SCK. The scan output flip-flop 90 which is disposed at the first one among the scan output flip-flops 90-92. The input terminal D of the scan output flip-flop 90 receives a functional data signal S90 to serve as its data signal S10, and the input terminal TD thereof receives a scan test signal S91 to serve as its test signal S11. The output signal S15 at the data output terminal Q of the scan output flip-flop 90 is transmitted to the combinatorial logic block 96, and the scan-out signal S16 at the scan output terminal SQ thereof is coupled to the delay chain 93. For each of the scan output flip-flops 91 and 92, the input terminal D receives the signal output from the corresponding combinatorial logic block to serve as its data signal S10, the input terminal TD thereof receives the signal output from the corresponding delay chain to serve as its test signal S11, the output signal S15 at the data output terminal Q thereof is transmitted to the following combinatorial logic block, and the scan-out signal S16 at the scan output terminal SQ thereof is coupled to the following chain.

As described above, each of the scan output flip-flops 90-92 has the same circuit structure in the embodiment of FIG. 1, 4, 5, or 8. Since the scan-out signal S16 is at a fixed voltage level (high voltage level in the embodiment of FIGS. 2A and 2B or low voltage level in the embodiment of FIGS. 6A and 6B) in the normal mode, the delay chains 93 and 94 do not continuously perform the delay operations, which decrease the power consumption of the scan chain 9. Moreover, as shown FIGS. 1, 4, 5, and 8, the gates of the transistors in the scan-out stage circuit 12 receive the control signals S13 and 14. In the test mode, when the voltage level of the control signals S13 and 14 are determined in response to the input signal S12 (that is, the test signal S11) at time point T30A, T30B, T70A, or T70B, the states of the transistors in the in the scan-out stage circuit 12 are also determined to generate the scan-out signal S16. Thus, the loading at the scan output terminal SQ has less effect on the delay of the transmission gate in the scan-out stage circuit 12.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A scan output flip-flop for outputting a scan-out signal at a first output terminal of the scan output flip-flop, comprising:
   a selection circuit having a first input terminal and a second input terminal and controlled by a first test enable signal to transmit a data signal on the first input terminal or a test signal on the second input terminal to an output terminal of the selection circuit to serve as an input signal;
   a control circuit coupled to the output terminal of the selection circuit and controlled by a first clock signal to generate a first control signal and a second control signal according to the input signal, wherein the second control signal is the inverse of the first control signal; and
   a scan-out stage circuit controlled by the first control signal and the second control signal to generate the scan-out signal;

wherein the scan-out stage circuit receives the first test enable signal or a second test enable signal which is the inverse of the first test enable signal, and the scan-out stage circuit is controlled by the first control signal and the second control signal to generate the scan-out signal according to the first test enable or the second test enable signal.

2. The scan output flip-flop as claimed in claim 1, wherein the control circuit outputs the first control signal to a second output terminal of the scan output flip-flop to serve as an output signal.

3. The scan output flip-flop as claimed in claim 1, wherein the control circuit comprises:
a first inverter receiving the second control signal and generating an output signal, wherein the output signal is transmitted to a second output terminal of the scan output flip-flop.

4. The scan output flip-flop as claimed in claim 3, wherein the control circuit further comprises:
a second inverter receiving the first control signal and generating the second control signal.

5. The scan output flip-flop as claimed in claim 1, wherein when the scan output flip-flop operates in a test mode, the selection circuit transmits the test signal to the output terminal of the selection circuit according to the first test enable signal to serve as the input signal, and a voltage level of the scan-out signal varies with a voltage level of the test signal.

6. The scan output flip-flop as claimed in claim 1, wherein when the scan output flip-flop operates in a normal mode, the selection circuit transmits the data signal to the output terminal of the selection circuit according to the first test enable signal to serve as the input signal, a voltage level of the output signal varies with a voltage level of the test signal, and the scan-out signal is at a fixed voltage level.

7. The scan output flip-flop as claimed in claim 1, wherein the scan-out stage circuit comprises:
a first-type transistor having a control electrode receiving the second control signal, a first electrode receiving the first test enable signal or a second test enable signal, and a second electrode coupled to the first output terminal of the scan output flip-flop, wherein the second test enable signal is the inverse of the first test enable signal;
a first second-type transistor having a control electrode receiving the first control signal, a first electrode receiving the first test enable signal or the second test enable signal, and a second electrode coupled to the first output terminal of the scan output flip-flop; and
a second second-type transistor having a control electrode receiving the second control signal, a first electrode coupled to a power terminal of the scan output flip-flop, and a second electrode coupled to the first output terminal of the scan output flip-flop.

8. The scan output flip-flop as claimed in claim 7, wherein the first-type transistor is implemented by an N-type transistor, the first second-type transistor and the second second-type transistor are implemented by P-type transistors, the first terminals of the first-type transistor and the first second-type transistor receive the second test enable signal, and the power terminal receives an operation voltage of the scan output flip-flop.

9. The scan output flip-flop as claimed in claim 7, wherein the first-type transistor is implemented by a P-type transistor, the first second-type transistor and the second second-type transistor are implemented by N-type transistors, the first terminals of the first-type transistor and the first second-type transistor receive the first test enable signal, and the power terminal receives a ground voltage of the scan output flip-flop.

10. A scan output flip-flop for outputting a scan-out signal at a first output terminal of the scan output flip-flop, comprising:
a multiplexer receiving a data signal and a test signal and generating an input signal, wherein the multiplexer is controlled by a first test enable signal to select either the data signal or the test signal to serve as the input signal;
a control circuit receiving the input signal and controlled by a first clock signal to generate a first control signal and a second control signal according to the input signal, wherein the second control signal is the inverse of the first control signal;
a first-type transistor having a control electrode receiving the second control signal, a first electrode receiving the first test enable signal or a second test enable signal, and a second electrode coupled to the first output terminal of the scan output flip-flop, wherein the second test enable signal is the inverse of the first test enable signal;
a first second-type transistor having a control electrode receiving the first control signal, a first electrode receiving the first test enable signal or the second test enable signal, and a second electrode coupled to the first output terminal of the scan output flip-flop; and
a second second-type transistor having a control electrode receiving the second control signal, a first electrode coupled to a power terminal of the scan output flip-flop, and a second electrode coupled to the first output terminal of the scan output flip-flop.

11. The scan output flip-flop as claimed in claim 10, wherein the control circuit outputs the first control signal to a second output terminal of the scan output flip-flop to serve as an output signal of the scan output flip-flop.

12. The scan output flip-flop as claimed in claim 10, wherein the control circuit comprises:
a first inverter receiving the second control signal and generating an output signal, wherein the output signal is transmitted to a second output terminal of the scan output flip-flop.

13. The scan output flip-flop as claimed in claim 12, wherein the control circuit further comprises:
a second inverter receiving the first control signal and generating the second control signal.

14. The scan output flip-flop as claimed in claim 10, wherein when the scan output flip-flop operates in a test mode, the multiplexer selects the test signal to serve as the input signal, and a voltage level of the scan-out signal varies with a voltage level of the test signal.

15. The scan output flip-flop as claimed in claim 10, wherein when the scan output flip-flop operates in a normal mode, the multiplexer selects the data signal to serve as the input signal, a voltage level of the output signal varies with a voltage level of the data signal, and the scan-out signal is at a fixed voltage level.

16. The scan output flip-flop as claimed in claim 10, wherein the first-type transistor is implemented by an N-type transistor, the first second-type transistor and the second second-type transistor are implemented by P-type transistors, the first terminals of the first-type transistor and the first second-type transistor receive the second test enable signal, and the power terminal receives an operation voltage of the scan output flip-flop.

17. The scan output flip-flop as claimed in claim 10, wherein the first-type transistor is implemented by a P-type transistor, the first second-type transistor and the second second-type transistor are implemented by N-type transistors, the first terminals of the first-type transistor and the first second-type transistor receive the first test enable signal, and the power terminal receives a ground voltage of the scan output flip-flop.

18. A scan output flip-flop for outputting a scan-out signal at a first output terminal of the scan output flip-flop, comprising:
- a selection circuit having a first input terminal and a second input terminal and controlled by a first test enable signal to transmit a data signal on the first input terminal or a test signal on the second input terminal to an output terminal of the selection circuit to serve as an input signal;
- a control circuit coupled to the output terminal of the selection circuit and controlled by a first clock signal to generate a first control signal and a second control signal according to the input signal, wherein the second control signal is the inverse of the first control signal;
- a scan-out stage circuit controlled by the first control signal and the second control signal to generate the scan-out signal;
- a first-type transistor having a control electrode receiving the second control signal, a first electrode receiving the first test enable signal or a second test enable signal, and a second electrode coupled to the first output terminal of the scan output flip-flop, wherein the second test enable signal is the inverse of the first test enable signal;
- a first second-type transistor having a control electrode receiving the first control signal, a first electrode receiving the first test enable signal or the second test enable signal, and a second electrode coupled to the first output terminal of the scan output flip-flop; and
- a second second-type transistor having a control electrode receiving the second control signal, a first electrode coupled to a power terminal of the scan output flip-flop, and a second electrode coupled to the first output terminal of the scan output flip-flop.

19. The scan output flip-flop as claimed in claim 18, wherein the first-type transistor is implemented by an N-type transistor, the first second-type transistor and the second second-type transistor are implemented by P-type transistors, the first terminals of the first-type transistor and the first second-type transistor receive the second test enable signal, and the power terminal receives an operation voltage of the scan output flip-flop.

20. The scan output flip-flop as claimed in claim 18, wherein the first-type transistor is implemented by a P-type transistor, the first second-type transistor and the second second-type transistor are implemented by N-type transistors, the first terminals of the first-type transistor and the first second-type transistor receive the first test enable signal, and the power terminal receives a ground voltage of the scan output flip-flop.

* * * * *